(12) United States Patent
Fujii (10) Patent No.: US 7,642,695 B2
(45) Date of Patent: Jan. 5, 2010

(54) PIEZOELECTRIC THIN-FILM RESONATOR

(75) Inventor: Hidetoshi Fujii, Ishikawa-gun (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 11/836,990

(22) Filed: Aug. 10, 2007

(65) Prior Publication Data

US 2007/0278899 A1    Dec. 6, 2007

Related U.S. Application Data

(63) Continuation of application No. PCT/JP2006/300309, filed on Jan. 12, 2006.

(30) Foreign Application Priority Data

Feb. 21, 2005    (JP) .................. 2005-043591

(51) Int. Cl.
*H03H 9/17* (2006.01)
(52) U.S. Cl. .............. 310/320; 310/311; 310/324
(58) Field of Classification Search .......... 310/324
See application file for complete search history.

(56) References Cited

U.S. PATENT DOCUMENTS

| | | | |
|---|---|---|---|
| 4,642,508 A | 2/1987 | Suzuki et al. | |
| 5,789,845 A | 8/1998 | Wadaka et al. | |
| 5,910,756 A | 6/1999 | Ella | |
| 6,271,619 B1* | 8/2001 | Yamada et al. | 310/324 |
| 6,424,237 B1* | 7/2002 | Ruby et al. | 333/187 |
| 6,441,539 B1 | 8/2002 | Kitamura et al. | |
| 6,724,580 B2 | 4/2004 | Irie et al. | |
| 6,788,170 B1* | 9/2004 | Kaitila et al. | 333/187 |
| 6,812,619 B1 | 11/2004 | Kaitila et al. | |
| 6,869,170 B2 | 3/2005 | Shimada et al. | |
| 2002/0051040 A1 | 5/2002 | Shimada et al. | |
| 2002/0085065 A1 | 7/2002 | Shimada et al. | |
| 2003/0067368 A1* | 4/2003 | Ohara et al. | 333/188 |

FOREIGN PATENT DOCUMENTS

| | | |
|---|---|---|
| JP | 60-189307 A | 9/1985 |
| JP | 61-218214 A | 9/1986 |
| JP | 61-218215 A | 9/1986 |

(Continued)

OTHER PUBLICATIONS

Official Communication for PCT Application No. PCT/JP2006/300309; mailed on Apr. 25, 2006.

(Continued)

*Primary Examiner*—Walter Benson
*Assistant Examiner*—Bryan P Gordon
(74) *Attorney, Agent, or Firm*—Keating & Bennett, LLP (57) ABSTRACT

A piezoelectric thin-film resonator and a method of manufacturing thereof eliminate and prevent breaking of a piezoelectric thin film, disconnection of electrodes, and other known problems. The piezoelectric thin-film resonator includes a substrate and a suspended portion including a vibrating portion in which a piezoelectric thin film is disposed between a pair of excitation electrodes. At least two film-like supports partially supported on the substrate are provided. The suspended portion is supported by the supports so as to be suspended above the substrate with an air-gap layer therebetween.

14 Claims, 4 Drawing Sheets

FOREIGN PATENT DOCUMENTS

| | | |
|---|---|---|
| JP | 63-067910 A | 3/1988 |
| JP | 08-148968 A | 6/1996 |
| JP | 08-186467 A | 7/1996 |
| JP | 09-130199 A | 5/1997 |
| JP | 11-088111 A | 3/1999 |
| JP | 2001-211053 A | 8/2001 |
| JP | 2001-309673 A | 11/2001 |
| JP | 2002-178514 A | 6/2002 |
| JP | 2003-505905 A | 2/2003 |
| JP | 2003-505906 A | 2/2003 |
| JP | 2004-007352 A | 1/2004 |
| JP | 3740061 B2 | 1/2006 |
| WO | 98/52280 A1 | 11/1998 |
| WO | 01/06647 A1 | 1/2001 |

OTHER PUBLICATIONS

Official communication issued in the counterpart Japanese Application No. 2007-503593, mailed on Jun. 18, 2009.

* cited by examiner

PIEZOELECTRIC THIN-FILM RESONATOR

BACKGROUND OF THE INVENTION

1. Field of the Invention

The present invention relates to a piezoelectric thin-film resonator.

2. Description of the Related Art

In piezoelectric thin-film resonators, in order to acoustically isolate a vibrating portion, in which a piezoelectric thin film is disposed between a pair of excitation electrodes facing each other, from a substrate, a structure is used in which a thin-film member (membrane) is partially suspended above the substrate with an air-gap layer therebetween.

Figure 1A:
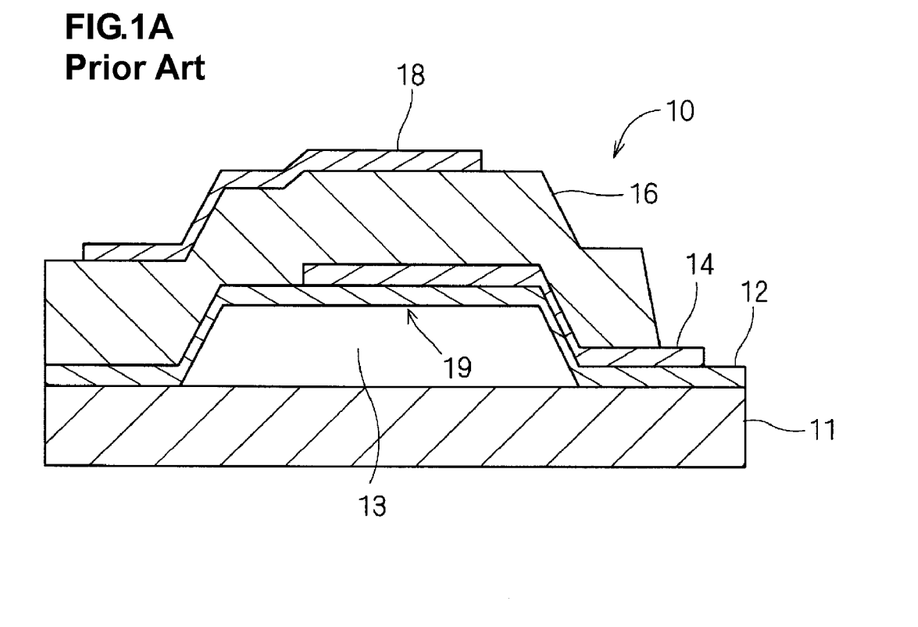
FIGS. 1A and 1B are a cross-sectional view and a plan view, respectively, of a conventional piezoelectric thin-film resonator.
Figure 1B:
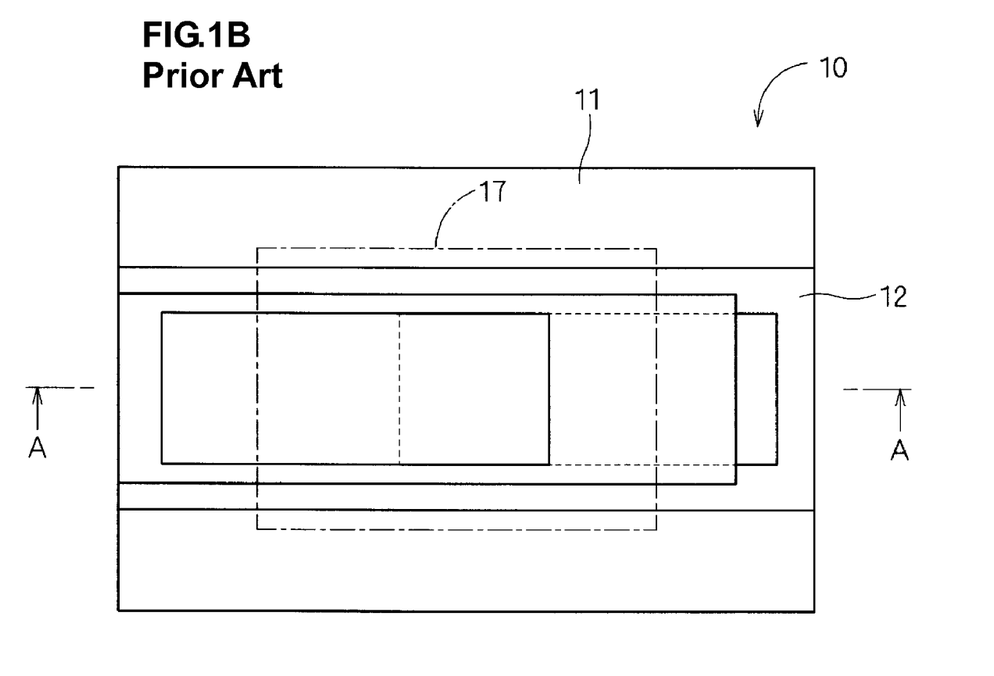

For example, as schematically shown in FIGS. 1A and 1B, a piezoelectric thin-film resonator 10 has a structure in which a dielectric film 12, a lower electrode 14, a piezoelectric thin film 16, and an upper electrode 18 are disposed on a substrate 11. An air-gap layer 13 (refer to FIG. 1A) is formed between the substrate 11 and the dielectric film 12. A portion in which the electrodes 14 and 18 overlap each other in the stacking direction and which includes the dielectric film 12, the lower electrode 14, the piezoelectric thin film 16, and the upper electrode 18, i.e., a vibrating portion 19, has a structure that is suspended above the substrate 11. The air-gap layer is formed by removing, in the final stage, a sacrificial layer 17 (refer to FIG. 1B) disposed between the substrate 11 and the dielectric film 12.

A thin-film member including the dielectric film 12, the lower electrode 14, the piezoelectric thin film 16, and the upper electrode 18 has a supported portion that is supported by the substrate and a suspended portion that is suspended above the substrate. In general, the suspended portion includes a middle section extending parallel to the substrate and a sloping section that is connected to the supported portion and the middle section, the sloping section extending obliquely with respect to the substrate. A part in which the sloping section is connected to the supported portion or the middle section has a bent shape in cross section (for example, refer to Japanese Unexamined Patent Application Publication No. 61-218214).

In the piezoelectric thin-film resonator having the structure that is bent in cross section as described above, breaking of the piezoelectric thin film and disconnection of the electrodes easily occur.

That is, in a resonator using a fundamental wave vibration mode, a membrane revealed after a sacrificial layer is removed includes a piezoelectric thin film and a pair of electrodes sandwiching the piezoelectric thin film. In such a case, since the strength of the membrane is low, the membrane may be broken, microcracking may occur, or the vibrating film may be deflected after the sacrificial layer is removed.

Strength can be provided to the membrane by forming a dielectric film on the upper or lower side of the piezoelectric thin film. However, if the dielectric film is formed such that sufficient strength is provided, the resonant bandwidth is decreased, thus degrading the resonant characteristic. When such a resonator is used, the bandwidth of a filter is also decreased, and it is not possible to fabricate a desired filter. Furthermore, when the dielectric film is formed, the stress of the dielectric film is added to the stress of the piezoelectric thin film, which may result in a further decrease in the strength of the membrane or deflection of the vibrating portion.

Furthermore, in the dicing step in which the individual elements are separated, breaking of the diaphragm easily occurs because the strength of the membrane may be insufficient. Moreover, during the mounting operation, since the vibrating portion is exposed, a load is likely to be applied to the vibrating portion, and breaking defects may easily occur in the element.

Consequently, the bending angle at the sloping section, i.e., the inclination angle relative to the substrate (slope angle), is preferably set as small as possible.

However, when the distance between the substrate and the middle section of the suspended portion is constant, it is necessary to increase the area of the sloping section of the suspended portion as the slope angle decreases, and the size of the element must be increased.

Consequently, in practice, the slope angle is at most limited to about 15 degrees, and it is not possible to completely eliminate the breaking of the piezoelectric thin film, disconnection of the electrodes, and the like.

SUMMARY OF THE INVENTION

In order to overcome the problems described above, preferred embodiments of the present invention provide a piezoelectric thin-film resonator in which breaking of a piezoelectric thin film, disconnection of electrodes, and the like can be substantially completely eliminated, and a method for fabricating the piezoelectric thin-film resonator is also provided.

In order to solve the problems described above, the present invention provides a piezoelectric thin-film resonator having the structure described below.

A piezoelectric thin-film resonator according to a preferred embodiment of the present invention includes a substrate, a suspended portion including a vibrating portion in which a piezoelectric thin film is disposed between a pair of excitation electrodes, and at least two film-like supports partially supported on the substrate, wherein the suspended portion is supported by the two film-like supports so as to be suspended above the substrate with an air-gap layer therebetween.

According to the structure described above, the piezoelectric thin film is disposed only in the suspended portion and is not disposed in the supports between the suspended portion and the substrate, in which the stress condition is complex. Thus, it is possible to eliminate breaking of the piezoelectric thin-film resonator element and disconnection of the electrodes. Furthermore, since the piezoelectric thin film is not present in the supports extending between the suspended portion and the substrate, it is not necessary to form sloping sections in the supports. Thus, it is possible to decrease the size of the piezoelectric thin-film resonator element.

Preferably, the at least two film-like supports are each made of a conductive film, one of the pair of excitation electrodes is electrically connected to one of the supports, and the other of the pair of excitation electrodes is electrically connected to the other of the supports.

According to the structure described above, it is possible to decrease the electrical resistance of wires connected to the pair of excitation electrodes sandwiching the piezoelectric thin film, and to increase the Q factor of the piezoelectric thin-film resonator.

Preferably, in the at least two film-like supports, portions not supported by the substrate extend to peripheral regions on the surface of the suspended portion on a side opposite the substrate.

According to the structure described above, it is possible to further decrease the electrical resistance of the wires, and to further increase the Q factor of the piezoelectric thin-film resonator.

Preferably, a surface including the boundary between the suspended portion and the air-gap layer is separated with a distance from a surface including the boundary between the substrate and the supports.

According to the structure described above, it is possible to use the substrate having a planar surface on the side in which the suspended portion including the piezoelectric thin film is disposed. If a substrate having a recess is used, the mechanical strength of the piezoelectric thin-film resonator is relatively decreased. However, by using the structure described above using a planar substrate, the mechanical strength of the piezoelectric thin-film resonator can be relatively increased.

In the piezoelectric thin-film resonator of preferred embodiments of the present invention and the method for fabricating the same, a simple shape can be formed in which an unreasonable force is not applied to a piezoelectric thin film, and thus it is possible to completely eliminate the breaking of the piezoelectric thin film, disconnection of the electrodes, and the like.

Other features, elements, steps, characteristics and advantages of the present invention will be described below with reference to preferred embodiments thereof and the attached drawings.

BRIEF DESCRIPTION OF THE DRAWINGS

Preferred embodiments according to the present invention will be described below with reference to FIGS. 2A to 4.

First Preferred Embodiment

Figure 2A:
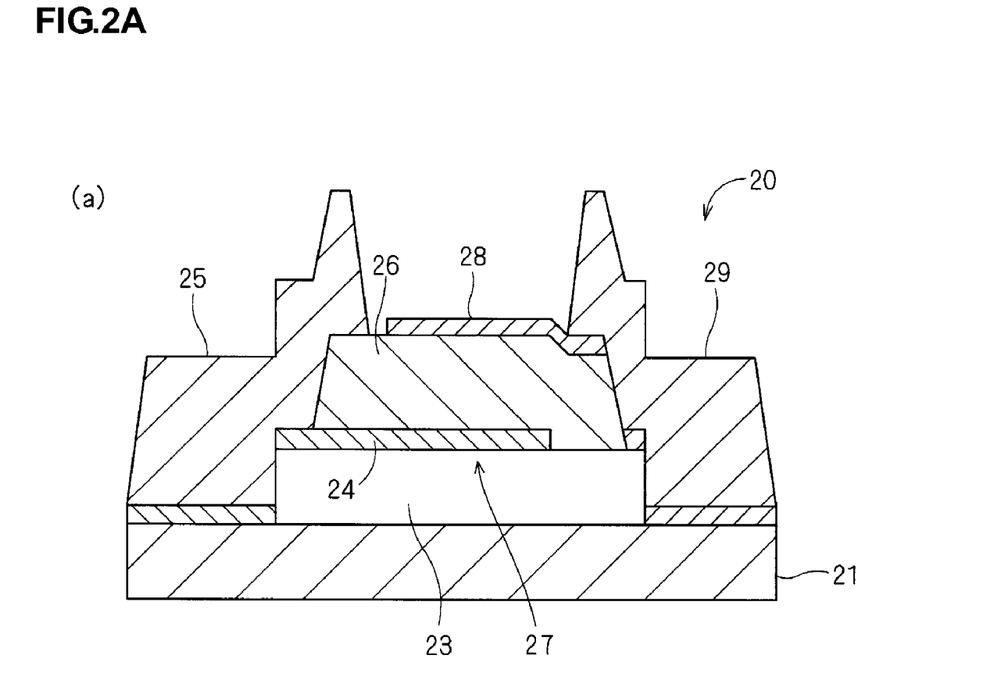
FIGS. 2A and 2B are a cross-sectional view and a plan view, respectively, of a piezoelectric thin-film resonator according to a first preferred embodiment of the present invention.
Figure 2B:
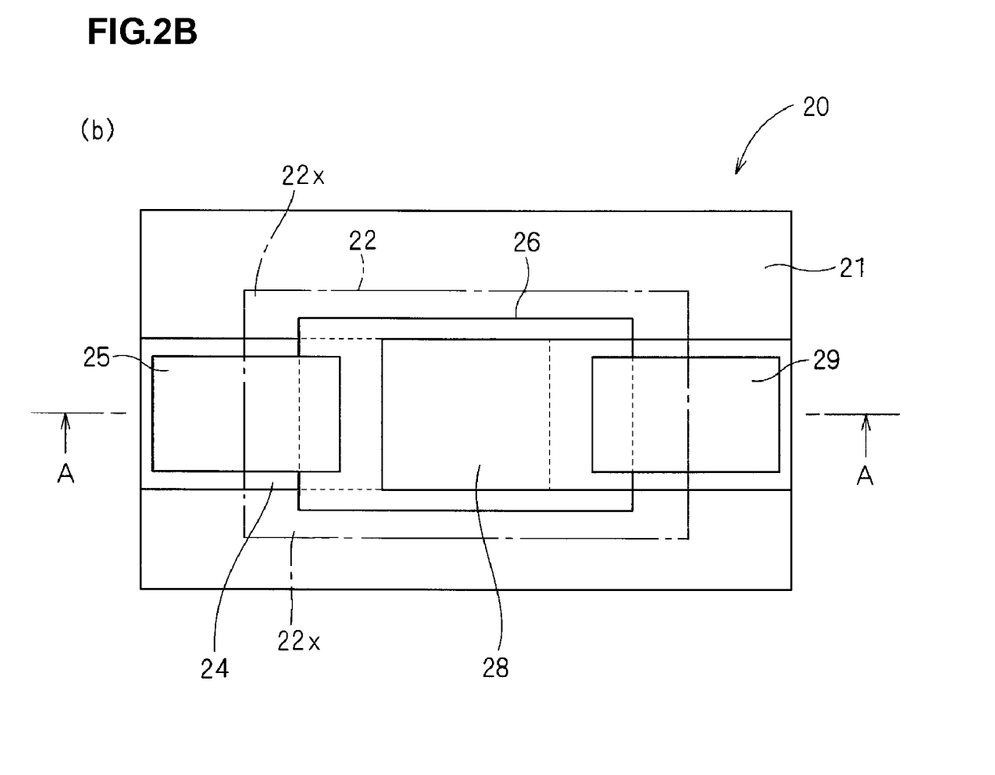

A piezoelectric thin-film resonator 20 according to the first preferred embodiment of the present invention will be described with reference to FIGS. 2A and 2B. FIG. 2B is a plan view schematically showing a structure of the piezoelectric thin-film resonator 20. FIG. 2A is a cross-sectional view taken along the line A-A of FIG. 2B.

In the piezoelectric thin-film resonator 20, a thin-film member is formed on a substrate 21, the thin-film member including a lower electrode 24, a piezoelectric thin film 26, an upper electrode 28, and reinforcing films 25 and 29. An air-gap layer 23 (refer to FIG. 2A) is formed between the substrate 21 and the lower electrode 24. A portion in which the electrodes 24 and 28 overlap each other in the stacking direction and which includes the lower electrode 24, the piezoelectric thin film 26, and the upper electrode 28, i.e., a vibrating portion 27, has a structure that is suspended above the substrate 21. The piezoelectric thin film 26 is disposed only in the portion suspended above the substrate 21 (above the air-gap layer 23). The air-gap layer 23 is formed by removing, in the final stage, a sacrificial layer 22 (refer to FIG. 2B) disposed between the substrate 21 and the lower electrode 24. The portion suspended above the substrate 21, i.e., a suspended portion, is supported by two film-like supports, each being disposed at one end of the substrate 21. The two supports are each made of a conductive film and include reinforcing films 25 and 29, respectively.

The piezoelectric thin-film resonator 20 is fabricated in the manner described below.

First, a sacrificial layer 22 is formed on a substrate 21. As the substrate 21, an inexpensive substrate having excellent workability is used. A Si substrate or glass substrate having a planar surface is preferable. The sacrificial layer 22, which is used for forming an air-gap layer made of zinc oxide or the like that is chemically easily soluble, is formed on the substrate 21 preferably using a technique such as sputtering or photo-etching. The sacrificial layer 22 is preferably made of a material that can withstand high temperatures which may occur during the formation of the piezoelectric thin film 26 and can be easily removed. For example, a metal, such as Ge, Sb, Ti, Al, or Cu; phosphosilicate glass (PSG); or a polymer is preferably used. Preferred examples of the polymer include polytetrafluoroethylene or a derivative thereof, polyphenylene sulfide, polyetherether ketone, polyimide, polyimide siloxane, vinyl ether, polyphenyl, parylene-n, parylene-f, and benzocyclobutene. The sacrificial layer 22 to be formed must have a thickness that prevents the vibrating portion 27 from being brought into contact with the substrate 21 even if the membrane is deflected. In view of ease of fabrication, the thickness is preferably in a range from about 50 nm to several micrometers. The minimum distance between the end of the sacrificial layer 22 and the vibrating portion 27 is preferably about 50 times or less the thickness of the vibrating portion 27.

Next, a lower electrode 24 is formed. The lower electrode 24 is formed on the sacrificial layer 22 and the substrate 21 using a film deposition method, such as sputtering, plating, CVD, or electron-beam deposition, and patterning by photolithography. The lower electrode 24 is formed, using a metal material, such as Mo, Pt, Al, Au, Cu, or Ti, as a principal component, from on the sacrificial layer 22 to on one side (in FIGS. 2A and 2B, on the left side) of the substrate 21 in a strip-shape.

Next, a piezoelectric thin film 26 is formed. The piezoelectric thin film 26 is formed, preferably using zinc oxide, aluminum nitride, or the like, by a film deposition method, such as sputtering, and a lift-off method using patterning by photolithography on a portion of the lower electrode 24 formed on the sacrificial layer 22. When an aluminum nitride layer is formed as the piezoelectric thin film 26, aluminum nitride is subjected to patterning by a lift-off method using zinc oxide. Alternatively, an aluminum nitride layer is formed, a resist pattern is formed thereon, and then the aluminum nitride layer is subjected to patterning by wet-etching using a strong alkaline solution.

Next, an upper electrode 28 is formed. The upper electrode 28 is formed on the piezoelectric thin film 26 and the substrate 21 as in the lower electrode 24. The upper electrode 28 is formed from on the piezoelectric thin film 26 to on the other side (in FIGS. 2A and 2B, on the right side) of the substrate 21 in a strip-shape.

Next, reinforcing films 25 and 29 are formed. The reinforcing films 25 and 29 are not formed in a region in which the lower electrode 24 and the upper electrode 28 sandwich the piezoelectric thin film 26. In view of ease of fabrication, preferably, the thickness of each of the reinforcing films 25 and 29 is in a range from about 50 nm to about 50 μm. The minimum distance between the end of each of the reinforcing films 25 and 29 and the vibrating portion 27 is about 50 times or less the thickness of the vibrating portion 27.

As the reinforcing films 25 and 29, a conductive material is used. The reinforcing films 25 and 29 are formed by plating, screen-printing, sputtering, CVD, electron-beam deposition, or the like. Examples of the material constituting the reinforcing films 25 and 29 include metal materials (including alloys) preferably containing at least one element selected from Al, Ag, Au, Co, Cr, Cu, Fe, In, Mo, Nb, Ni, Ti, Pd, Pt, W, and Zr. The reinforcing films 25 and 29 are formed as much as possible, so as to cover portions of the electrodes not included in the vibrating portion 27.

Next, an etch hole is formed. The etch hole is used for removing the sacrificial layer 22 after the films constituting a resonator are formed. An end $22x$ of the sacrificial layer 22 protruding from the electrodes 24 and 28 and the piezoelectric thin film 26 can be used as the etch hole. The etch hole may be formed at a location distant from the vibrating portion 27 and the electrodes 24 and 28. Furthermore, in order to reduce the size as much as possible and to shorten the etching time, the etch hole may be formed so as to partially pass through the reinforcing films 25 and 29 connected to the electrodes 24 and 28. In such a case, preferably, the reinforcing films 25 and 29 are left in the periphery of the etch hole so that the etch hole is reinforced by the reinforcing films 25 and 29.

Next, the sacrificial layer 22 is etched from the etch hole $22x$ to form an air-gap layer 23. When etching is performed, the electrodes 24 and 28, the piezoelectric thin film 26, and the reinforcing films 25 and 29 may be covered with an etch mask made of a photoresist or the like. Subsequently, for example, when zinc oxide is used for the sacrificial layer 22, zinc oxide is removed using an acidic solution, such as hydrochloric acid or phosphoric acid. After the etching, the etch mask made of a photoresist or the like is removed using an organic solvent, such as acetone. In the case where the sacrificial layer 22 is etched using a solution that does not etch the piezoelectric thin film 26, the electrodes 24 and 28, and the reinforcing films 25 and 29, steps of patterning by photolithography and removal of the etch mask can be eliminated. For example, when Au or Pt is used for the electrodes 24 and 28 and aluminum nitride is used for the piezoelectric thin film 26, it is possible to remove the zinc oxide of the sacrificial layer 22 using a mixed solution including acetic acid, phosphoric acid, etc. without patterning. After the etching, the etching solution is fully replaced with a volatile solution, such as IPA, followed by drying. The air-gap layer 23 is thereby formed.

A plurality of elements are formed simultaneously using a wafer by the method described above, and the individual elements are separated from each other by dicing or the like. Then, packaging is performed.

In the piezoelectric thin-film resonator 20, since the end of the sacrificial layer 22 may be steep as shown in FIG. 2A, an epitaxial ZnO film can be used as the sacrificial layer 22. In such a case, the orientation of the lower electrode 24 and the piezoelectric thin film 26 formed on the sacrificial layer 22 can be improved compared with those in the conventional art, and the resonator characteristics can be improved. In the conventional art, as shown in FIGS. 1A and 1B, since the piezoelectric thin film 16 is bent, it has been necessary to use, as the sacrificial layer 17, a ZnO film capable of forming a gentle slope at the end of the sacrificial layer 17 in order to relieve stress. It has been difficult to align the orientation of the piezoelectric thin film 16 formed on such a sacrificial layer 17.

A metal is used for the reinforcing films 25 and 29 formed in portions connecting between the vibrating portion 27 and the substrate 21. Although the metal has a higher expansion coefficient than the substrate 21 or the piezoelectric thin film 26, the metal is ductile and malleable, and thus, it is possible to relieve the thermal stress due to the difference in the expansion coefficient from the substrate 21 or the piezoelectric thin film 26.

In the piezoelectric thin-film resonator 20, for example, when the resonant frequency is 2 GHz, the vibrating portion 27, in which the lower electrode 24 and the upper electrode 28 overlap each other, preferably has a substantially rectangular shape with a side of about 0.1 mm in plan view. If the height of the air-gap layer 23 is preferably about 1 μm and the slope angle at the end of the sacrificial layer 22 is about 15 degrees, the required length of the sloping section at each of the sides from which the electrodes 24 and 28 are extracted (in FIG. 2A, left and right sides) is about several micrometers. According to Example 1, it is possible to reduce the size of the element by eliminating sloping sections.

As described above, in the piezoelectric thin-film resonator 20, the reinforcing films 25 and 29 are formed in portions in which stress concentration occurs after the sacrificial layer 22 is removed, i.e., in junctions of the membrane with the substrate and their vicinities. Thus, the strength of the membrane is increased, and the defects in properties due to cracks and deflection of the membrane can be decreased.

Furthermore, in the piezoelectric thin-film resonator 20, the piezoelectric thin film 26 is formed only in the suspended portion suspended above the substrate 21 with the air-gap layer 23 therebetween, and the piezoelectric thin film 26 is connected to the substrate 21 via the electrode layers 24 and 28 and the reinforcing films 25 and 29. Thus, regardless of the shape of the ends of the sacrificial layer 22 (air-gap layer 23) and the piezoelectric thin film 26, wiring can be performed without defects in resistance. Consequently, it is not necessary to provide sloping sections in portions where the vibrating portion 27 is connected to the substrate 21, and the size of the element can be reduced.

Furthermore, the process can be stabilized. That is, since the vibrating portion 27 is receded from the reinforcing films 25 and 29, a load is not easily applied to the vibrating portion 27. Moreover, since the strength of the membrane is reinforced, the element is not broken during the mounting operation. Also in the dicing step, since the strength of the membrane is reinforced, breaking of the diaphragm does not occur.

Furthermore, since the freedom in selecting the material for the sacrificial layer 22 increases, it is also possible to use an epitaxial zinc oxide sacrificial layer formed on the substrate 21. In such a case, the electrode 24 and the piezoelectric thin film 26 can be easily epitaxially grown on the sacrificial layer 22. Thus, improvement can be expected in properties due to improvement in the film quality of the piezoelectric thin film 26, and in power durability due to improvement in the film quality of the lower electrode 24 and the piezoelectric thin film 26.

Second Preferred Embodiment

Figure 3A:
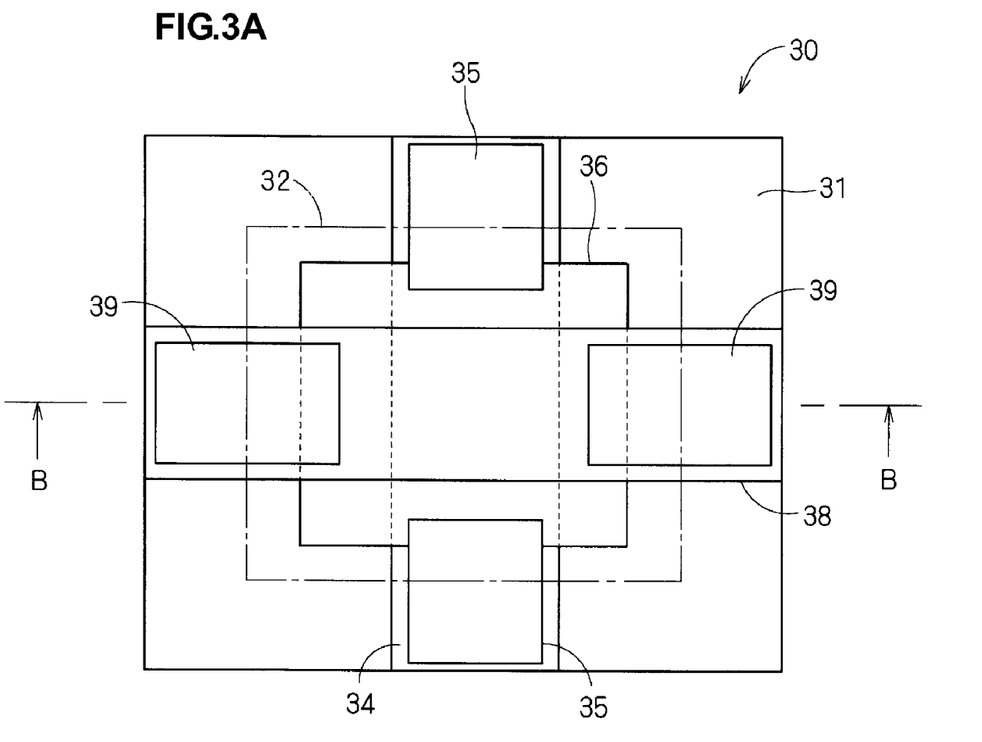
FIGS. 3A and 3B are a cross-sectional view and a plan view, respectively, of a piezoelectric thin-film resonator according to a second preferred embodiment of the present invention.
Figure 3B:
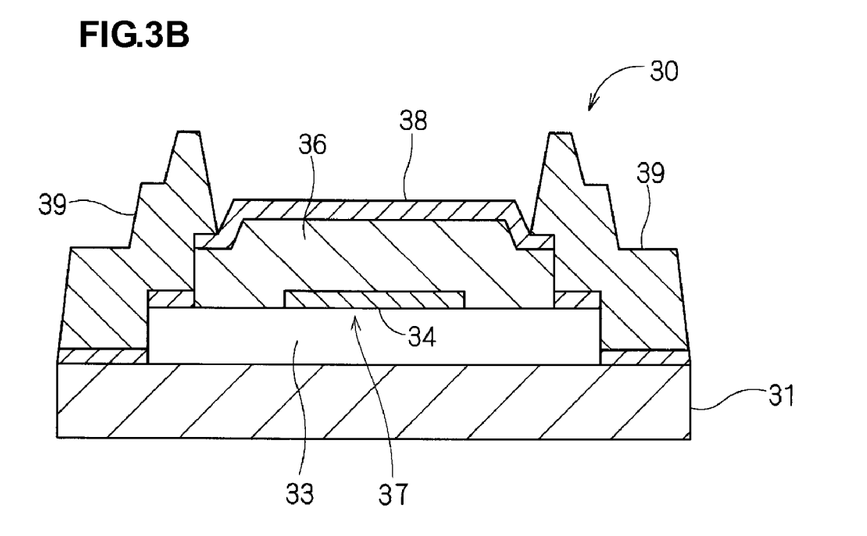

A piezoelectric thin-film resonator 30 according to the second preferred embodiment of the present invention will be described with reference to FIGS. 3A and 3B. FIG. 3A is a plan view schematically showing a structure of the piezoelectric thin-film resonator 30. FIG. 3B is a cross-sectional view taken along the line B-B of FIG. 3A.

In the piezoelectric thin-film resonator 30, unlike the first preferred embodiment, a lower electrode 34 and an upper electrode 38 intersect each other like a cross. In the piezoelectric thin-film resonator 30, the lower electrode 34, a piezoelectric thin film 36, the upper electrode 38, and reinforcing films 35 and 39 are formed on a substrate 31 in substantially the same manner as in the first preferred embodiment. An air-gap layer 33 (refer to FIG. 3B) is formed between the substrate 31 and the lower electrode 34. A portion in which the electrodes 34 and 38 overlap each other in the stacking direction and which includes the lower electrode 34, the piezoelectric thin film 36, and the upper electrode 38, i.e., a vibrating portion 37, has a structure that is suspended above the substrate 31. The piezoelectric thin film 36 is disposed only in the portion suspended above the substrate 31 (above the air-gap layer 33). The air-gap layer 33 is formed by removing, in the final stage, a sacrificial layer 32 (refer to FIG. 3A) disposed between the substrate 31 and the lower electrode 34.

Third Preferred Embodiment

Figure 4:
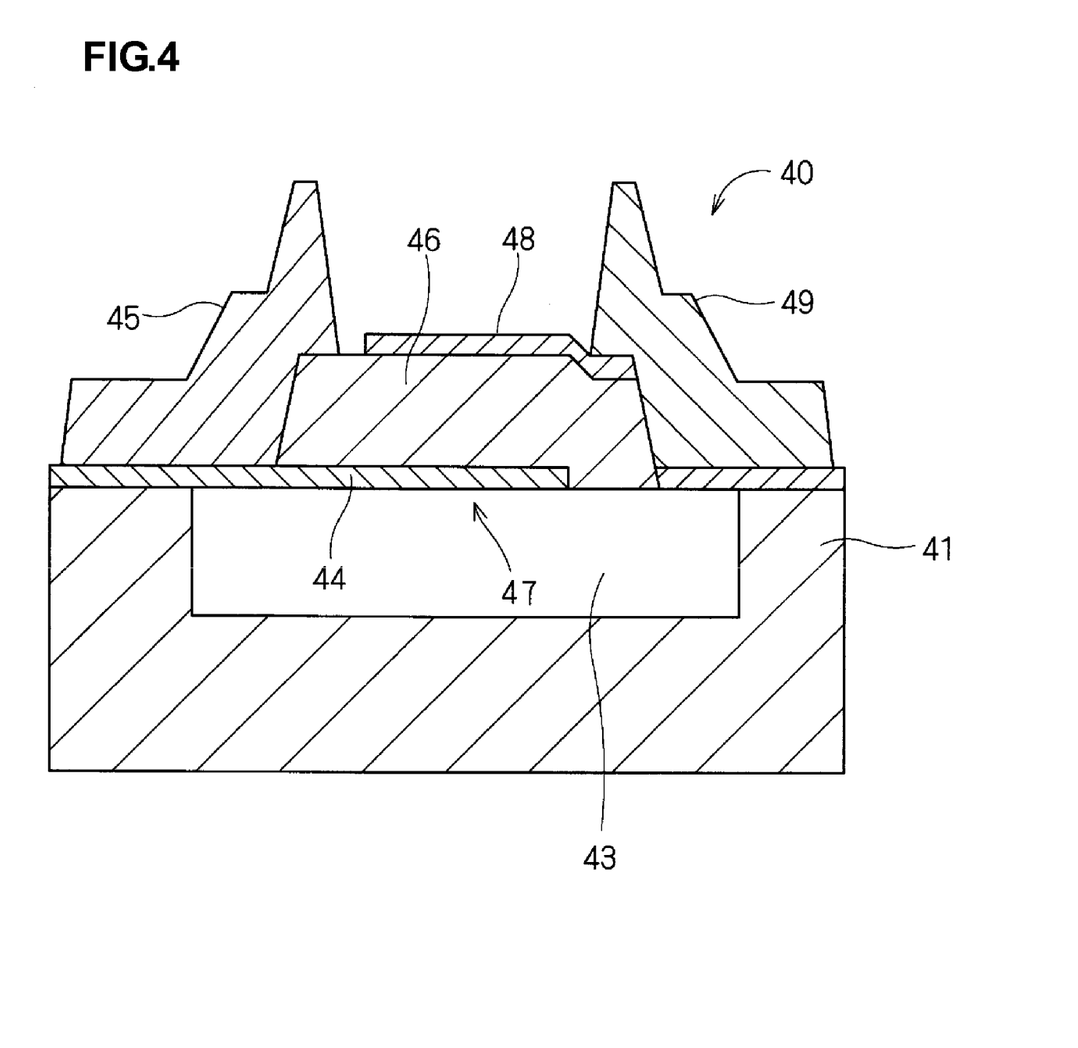
FIG. 4 is a cross-sectional view of a piezoelectric thin-film resonator according to a third preferred embodiment of the present invention.

A piezoelectric thin-film resonator 40 according to the third preferred embodiment of the present invention will be described with reference to FIG. 4. FIG. 4 is a cross-sectional view schematically showing a structure of the piezoelectric thin-film resonator 40.

In the piezoelectric thin-film resonator 40, unlike the first preferred embodiment, a recess 43 is formed in a substrate 41. In the piezoelectric thin-film resonator 40, a lower electrode 44, a piezoelectric thin film 46, an upper electrode 48, and reinforcing films 45 and 49 are formed on a substrate 41 in substantially the same manner as in the first preferred embodiment. A portion in which the electrodes 44 and 48 overlap each other in the stacking direction and which includes the lower electrode 44, the piezoelectric thin film 46, and the upper electrode 48, i.e., a vibrating portion 47, is disposed above the recess 43 of the substrate 41, and the vibrating portion 47 is suspended in a space. The piezoelectric thin film 46 is disposed only in the portion suspended above the substrate 41 (above the recess 43). The piezoelectric thin film 46 has a planar shape and the bending of the piezoelectric thin film 46, i.e., the slope angle, is zero degrees.

The piezoelectric thin-film resonator 40 can be fabricated by substantially the same procedure as in the first preferred embodiment. That is, after the recess 43 is formed in the substrate 41, the recess 43 is filled with a sacrificial layer to obtain a flat state. In such a state, the lower electrode 44, the piezoelectric thin film 46, the upper electrode 48, the reinforcing films 45 and 49 are formed as in the first preferred embodiment. Finally, the sacrificial layer is removed from the recess 43.

Variations of the first through third preferred embodiments 3 will now be described below.

First Variation Preferred Embodiment

In the second preferred embodiment, with respect to each two of the reinforcing films 35 and 39 to be formed on the electrodes 34 and 38, respectively, one of them may be composed of only a metal material, and the other may be formed so as to have a multilayered structure having two or more layers including an insulating layer. In such a case, the multilayered structure is designed so as to include, in addition to a conductive layer that electrically connects a portion of the electrode adjacent to the piezoelectric thin film to a portion adjacent to the substrate, an insulating layer made of an insulating material containing silicon oxide, silicon nitride, alumina, aluminum nitride, titanium oxide, tantalum oxide, or the like as a principal component.

As described above, although the metal has a higher expansion coefficient than the substrate or the piezoelectric thin film, the metal is ductile and malleable, and thus, it is possible to relieve the thermal stress due to the difference in the expansion coefficient from the substrate or the piezoelectric thin film. On the other hand, when a non-metal or a metal oxide is used as the reinforcing film, because of its expansion coefficient close to that of the substrate or the piezoelectric thin film, the non-metal or the metal oxide is advantageous with respect to thermal stress. However, because of its brittleness, the non-metal or the metal oxide is easily broken by external force, which is disadvantageous. In the first preferred variation embodiment, the advantage of the reinforcing film made of the metal and the advantage of the reinforcing film made of the non-metal or the metal oxide are combined.

As in the second preferred embodiment, since the reinforcing films are formed in portions in which stress concentration occurs after the sacrificial layer is removed, the strength of the membrane is increased, and the defects in properties due to cracks and deflection of the membrane can be decreased.

When the reinforcing film is made of only a metal material, the reinforcing film must be arranged such that the lower electrode and the upper electrode are not electrically short-circuited to each other and such that the parasitic capacitance between the electrodes does not adversely affect the resonance characteristic. If an insulating material is used, electrical wiring of the resonator can be eliminated from consideration. Thus, the freedom of layout of the reinforcing material can be increased.

By using a reinforcing film having a multilayered structure using a metal material and an insulating material, it is possible to relieve the stress of the reinforcing film, and thus, the strength of the membrane is improved.

When aluminum nitride having high thermal conductivity is used as the reinforcing film, the heat dissipation effect is also increased, and thus it is possible to obtain a piezoelectric thin-film resonator having excellent power durability.

By using a reinforcing film composed of only a metal, mainly, stress is relieved.

Second Variation Preferred Embodiment

In each of the first through third preferred embodiments, the lower electrode and the upper electrode constituting the vibrating portion are sandwiched by dielectric films. As the dielectric films, for example, a nitride, such as silicon nitride or aluminum nitride, an oxide, such as silicon oxide or aluminum oxide, or the like is preferably used. By sandwiching the vibrating portion by the dielectric films, the vibrating portion is protected from moisture and corrosive substances, and thus the reliability of the element is improved.

In the piezoelectric thin-film resonators in the preferred embodiments described above, it is not necessary to provide sloping sections. Consequently, a simple shape can be formed in which an unreasonable force is not applied to the piezoelectric thin film, and thus it is possible to completely eliminate the breaking of the piezoelectric thin film, disconnection of the electrodes, and the like.

It is to be understood that the present invention is not limited to the preferred embodiments described above, and various modifications are possible.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A piezoelectric thin-film resonator comprising:
a substrate;
a suspended portion including a vibrating portion in which a piezoelectric thin film is disposed between a pair of excitation electrodes; and
at least two supports partially supported on the substrate; wherein
the suspended portion is supported by the at least two supports so as to be suspended above the substrate with an air-gap layer therebetween;
the at least two supports are made of a material that is different from a material from which the piezoelectric thin film is made; and
portions of the at least two supports not directly in contact with the substrate extend to peripheral regions on a surface of the suspended portion on a side opposite to the substrate.

2. The piezoelectric thin-film resonator according to claim 1, wherein the at least two supports are film supports.

3. The piezoelectric thin-film resonator according to claim 1, wherein each of the at least two supports includes a conductive film, one of the pair of excitation electrodes is electrically connected to one of the supports, and the other of the pair of excitation electrodes is electrically connected to the other of the supports.

4. The piezoelectric thin-film resonator according to claim 1, wherein a surface including the boundary between the suspended portion and the air-gap layer is separated by a distance from a surface including the boundary between the substrate and the supports.

5. The piezoelectric thin-film resonator according to claim 1, wherein the substrate is made of one of Si and glass.

6. The piezoelectric thin-film resonator according to claim 1, wherein the pair of excitation electrodes extend in directions that are substantially perpendicular to one another to define a cross arrangement.

7. The piezoelectric thin-film resonator according to claim 1, wherein the substrate has a recess formed therein and the suspended portion is located above the recess.

8. A piezoelectric thin-film resonator comprising:
a substrate;
a suspended portion including a vibrating portion in which a piezoelectric thin film is disposed between a pair of excitation electrodes; and
at least two supports partially supported on the substrate; wherein
the suspended portion is supported by the at least two supports so as to be suspended above the substrate with an air-gap layer therebetween;
the at least two supports are made of a material that is different from a material from which the piezoelectric thin film is made;
the suspended portion includes a lower main surface and an upper main surface, the upper main surface being arranged farther from the substrate than the lower main surface; and
portions of the at least two supports not in direct in contact with the substrate extend to peripheral regions of the upper main surface of the suspended portion.

9. The piezoelectric thin-film resonator according to claim 8, wherein the at least two supports are film supports.

10. The piezoelectric thin-film resonator according to claim 8, wherein each of the at least two supports includes a conductive film, one of the pair of excitation electrodes is electrically connected to one of the supports, and the other of the pair of excitation electrodes is electrically connected to the other of the supports.

11. The piezoelectric thin-film resonator according to claim 8, wherein a surface including the boundary between the suspended portion and the air-gap layer is separated by a distance from a surface including the boundary between the substrate and the supports.

12. The piezoelectric thin-film resonator according to claim 8, wherein the substrate is made of one of Si and glass.

13. The piezoelectric thin-film resonator according to claim 8, wherein the pair of excitation electrodes extend in directions that are substantially perpendicular to one another to define a cross arrangement.

14. The piezoelectric thin-film resonator according to claim 8, wherein the substrate has a recess formed therein and the suspended portion is located above the recess.

* * * * *